United States Patent
Bi et al.

(10) Patent No.: US 11,677,026 B2
(45) Date of Patent: Jun. 13, 2023

(54) TRANSISTOR HAVING WRAP-AROUND SOURCE/DRAIN CONTACTS

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/291,336

(22) Filed: Mar. 4, 2019

(65) Prior Publication Data

US 2020/0287039 A1    Sep. 10, 2020

(51) Int. Cl.
| | |
|---|---|
| *H01L 29/78* | (2006.01) |
| *H01L 29/417* | (2006.01) |
| *H01L 29/08* | (2006.01) |
| *H01L 29/06* | (2006.01) |
| *H01L 29/423* | (2006.01) |
| *H01L 29/66* | (2006.01) |
| *H01L 29/10* | (2006.01) |

(Continued)

(52) U.S. Cl.
CPC ........ *H01L 29/785* (2013.01); *H01L 29/0673* (2013.01); *H01L 29/0847* (2013.01); *H01L 29/1037* (2013.01); *H01L 29/41766* (2013.01); *H01L 29/41791* (2013.01); *H01L 29/42392* (2013.01); *H01L 29/66795* (2013.01); *H01L 21/0262* (2013.01); *H01L 21/02532* (2013.01); *H01L 21/26513* (2013.01); *H01L 21/31116* (2013.01); *H01L 21/32137* (2013.01); *H01L 21/32139* (2013.01); *H01L 29/6656* (2013.01); *H01L 29/66545* (2013.01); *H01L 2029/7858* (2013.01)

(58) Field of Classification Search
CPC ........ H01L 2924/0002; H01L 2924/00; H01L 27/088; H01L 29/0673; H01L 29/785
See application file for complete search history.

(56) References Cited

U.S. PATENT DOCUMENTS

| | | |
|---|---|---|
| 6,441,435 B1 | 8/2002 | Chan |
| 7,241,655 B2 | 7/2007 | Tang et al. |
| | (Continued) | |

OTHER PUBLICATIONS

Carr et al., "Formation of Wrap-Around-Contact to Reduce Contact Resistivity," U.S. Appl. No. 16/026,521, filed Jul. 3, 2018.

(Continued)

*Primary Examiner* — Tony Tran
(74) *Attorney, Agent, or Firm* — Cantor Colburn LLP; Robert Sullivan

(57) ABSTRACT

Embodiments of the invention are directed to a method of forming a semiconductor device. A non-limiting example of the method includes performing fabrication operations to form a field effect transistor (FET) device on a substrate. The fabrication operations include forming a channel region over the substrate, forming a bottom conductive layer of a wrap-around source or drain (S/D) contact over the substrate, and forming a S/D region over the bottom conductive layer and adjacent to the channel region. The S/D region is communicatively coupled to the channel region and the bottom conductive layer.

12 Claims, 15 Drawing Sheets

(51) Int. Cl.
*H01L 21/02* (2006.01)
*H01L 21/3213* (2006.01)
*H01L 21/311* (2006.01)
*H01L 21/265* (2006.01)

(56) References Cited

U.S. PATENT DOCUMENTS

| | | | |
|---|---|---|---|
| 7,374,990 B2 | 5/2008 | Tang et al. | |
| 9,159,794 B2 | 10/2015 | Yu et al. | |
| 9,318,581 B1 | 4/2016 | Guo et al. | |
| 9,397,197 B1 | 7/2016 | Guo et al. | |
| 9,406,804 B2 | 8/2016 | Huang et al. | |
| 9,704,744 B2 | 7/2017 | Leib et al. | |
| 9,805,989 B1 | 10/2017 | Adusumilli et al. | |
| 9,847,390 B1 | 12/2017 | Xie et al. | |
| 10,388,569 B1* | 8/2019 | Cheng | H01L 21/823807 |
| 2013/0092988 A1 | 4/2013 | Uozumi | |
| 2013/0187228 A1 | 7/2013 | Xie et al. | |
| 2015/0255604 A1 | 9/2015 | Yang | |
| 2016/0148936 A1 | 5/2016 | Xu et al. | |
| 2017/0047411 A1 | 2/2017 | Cheng et al. | |
| 2017/0054003 A1 | 2/2017 | Liao et al. | |
| 2017/0207095 A1 | 7/2017 | Lee et al. | |
| 2018/0006159 A1 | 1/2018 | Guillorn et al. | |
| 2018/0047832 A1* | 2/2018 | Tapily | H01L 29/66439 |
| 2018/0090582 A1 | 3/2018 | Adusumilli et al. | |
| 2018/0197965 A1 | 7/2018 | Adusumilli et al. | |
| 2020/0044087 A1* | 2/2020 | Guha | H01L 29/42392 |

OTHER PUBLICATIONS

Chew et al., "Ultralow Resistive Wrap Around Contact to Scaled FinFET Devices by using ALD-Ti Contact Metal," 2017 IEEE International Interconnect Technology Conference (IITC), IEEE, 2017, 3 pages.

List of IBM Patents or Patent Applications Treated as Related; Date Filed: Mar. 4, 2019, 2 pages.

Loubet et al., "Stacked Nanosheet Gate-All-Around Transistor to Enable Scaling Beyond FinFET", 2017 Symposium on VLSI Technology Digest of Technical Papers, pp. T230-T231.

Disclosed Anonymously, "A Structure for Forming a Contact with Improved Contact Resistance and Overlay Tolerance," IPCOM000226568D, Apr. 2013, 5 pages.

\* cited by examiner

TRANSISTOR HAVING WRAP-AROUND SOURCE/DRAIN CONTACTS

BACKGROUND

The present invention relates in general to fabrication methods and resulting structures for semiconductor devices. More specifically, the present invention relates to fabrication methods and resulting structures for transistors having wrap-around contacts configured to reduce the transistor's source or drain (S/D) contact resistance.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. For example, nanosheet transistors, in contrast to conventional planar FETs, include a gate stack that wraps around the full perimeter of multiple nanosheet channel regions for improved control of channel current flow. Nanosheet transistors enable full depletion in the nanosheet channel regions and reduce short-channel effects.

SUMMARY

Embodiments of the invention are directed to a method of forming a semiconductor device. A non-limiting example of the method includes performing fabrication operations to form a FET device on a substrate. The fabrication operations include forming a channel region over the substrate, forming a bottom conductive layer of a wrap-around S/D contact over the substrate, and forming a S/D region over the bottom conductive layer and adjacent to the channel region. The S/D region is communicatively coupled to the channel region and the bottom conductive layer.

Embodiments of the invention are directed to a FET device configured to include a channel region formed over a substrate, a bottom conductive layer of a wrap-around S/D contact formed over the substrate, and a S/D region formed over the bottom conductive layer and adjacent to the channel region. The S/D region is communicatively coupled to the channel region and the bottom conductive layer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-11C depict a nanosheet-based structure after various fabrication operations for forming a nanosheet FET having a wrap-around source or drain (S/D) contact configured and arranged to reduce S/D contact resistance in accordance with aspects of the invention, in which:

FIG. 1 depicts a cross-sectional view of a nanosheet-based structure after initial fabrication operations in accordance with aspects of the present invention;

FIG. 2A depicts a top-down view of the nanosheet-based structure after additional fabrication operations in accordance with aspects of the present invention;

FIG. 2B depicts a cross-sectional view of the nanosheet-based structure shown in FIG. 2A taken along line A-A';

FIG. 3 depicts a cross-sectional view, taken along line A-A', of the nanosheet-based structure after additional fabrication operations in accordance with aspects of the invention;

FIG. 4 depicts a cross-sectional view, taken along line A-A', of the nanosheet-based structure after additional fabrication operations in accordance with aspects of the invention;

FIG. 6 depicts a cross-sectional view, taken along line A-A', of the nanosheet-based structure after additional fabrication operations in accordance with aspects of the invention;

FIG. 7 depicts a cross-sectional view, taken along line A-A', of the nanosheet-based structure after additional fabrication operations in accordance with aspects of the invention;

FIG. 8 depicts a cross-sectional view, taken along line A-A', of the nanosheet-based structure after additional fabrication operations in accordance with aspects of the invention;

FIG. 9 depicts a cross-sectional view, taken along line A-A', of the nanosheet-based structure after additional fabrication operations in accordance with aspects of the invention;

FIG. 11C a cross-sectional isolated view, taken along line B-B', showing the wrap-around S/D contact of FIGS. 11A and 11B.

DETAILED DESCRIPTION

Figure 1:
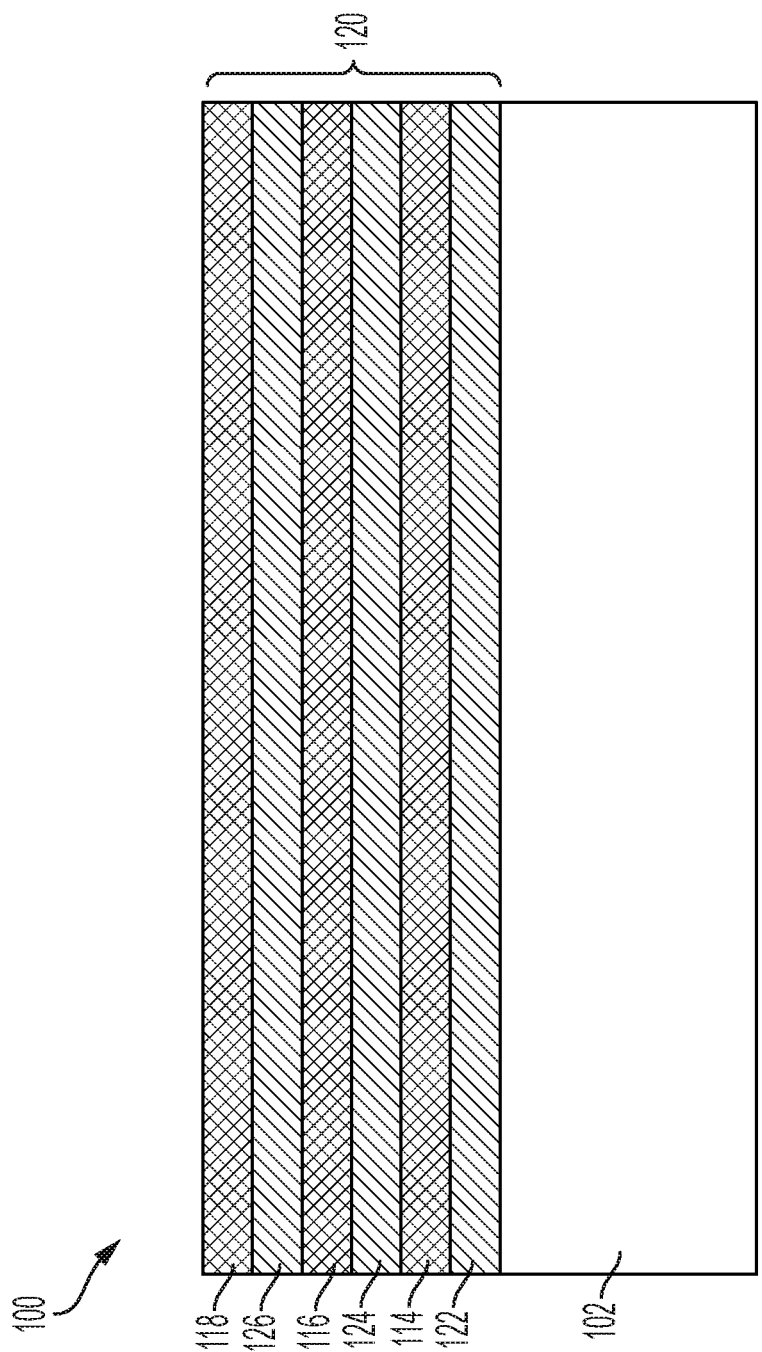
Figure 2:
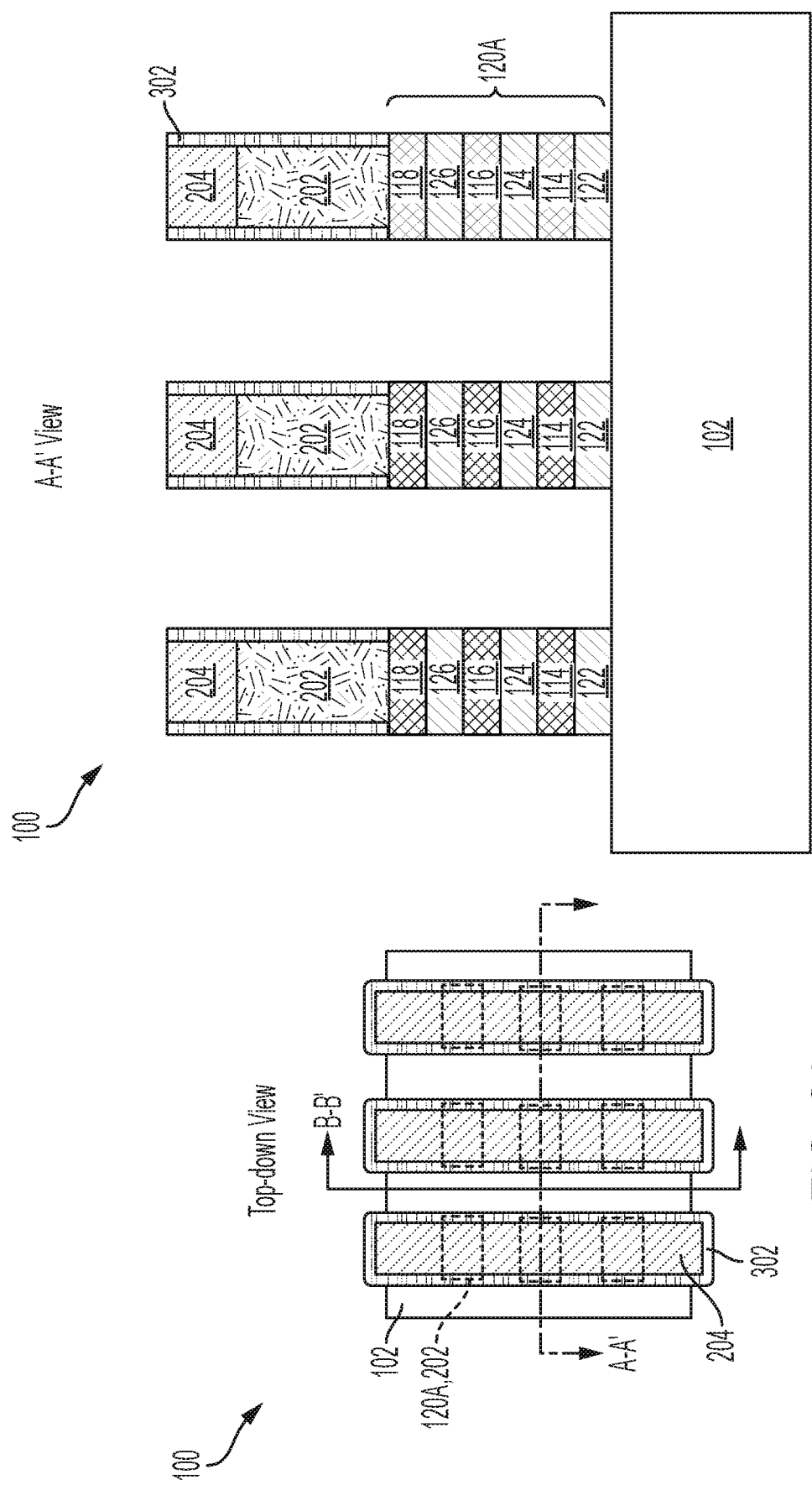

Although this detailed description includes examples of how aspects of the invention can be implemented to form wrap-around S/D contacts in an exemplary gate-all-around (GAA) nanosheet FET architecture having silicon (Si) channel nanosheets and SiGe sacrificial nanosheets, implementation of the teachings recited herein are not limited to a particular type of FET structure or combination of materials. Rather, embodiments of the present invention are capable of being implemented in conjunction with any other type of transistor device (e.g., planar FETs, FinFETs, vertical FETs, and the like) or material, now known or later developed, wherein S/D contact are utilized, and wherein it is desirable to reduce resistance at the interface between the S/D contact and the S/D region.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, as the size of MOSFETs and other devices decreases, the dimensions of S/D regions, channel regions, and gate electrodes also decrease. Accordingly, with device size reductions, the contribution of middle-of-line (MOL) contact resistance to the total parasitic resistance is increasing in advanced CMOS devices. Thus, resistance at the interface between the S/D contact and the S/D regions can be a major contributor to the total external parasitic resistance.

Turning now to an overview of aspects of the invention, embodiments of the invention provide fabrication methods and resulting structures for transistors having wrap-around contacts configured to reduce contact resistance by increasing the surface area of the interface between the S/D contact and the S/D region of the transistor. In embodiment of the invention, the surface area of the interface between the S/D contact and the S/D region is increased by, prior to forming the S/D region, depositing a bottom metal layer and forming the S/D region over the bottom metal layer such that a bottom surface of the S/D region contacts a first portion of a top surface of the bottom metal layer. In aspects of the invention, the transistor is a nanosheet FET, and the S/D regions are formed by epitaxially growing the S/D regions from exposed ends of the channel nanosheets of the nanosheet FET. The total top surface of the bottom metal layer is larger than the bottom surface of the S/D regions such that the S/D region's bottom surface contacts a first portion of the top surface of the bottom metal layer, thereby leaving a second portion of the top surface of the bottom metal layer exposed. A S/D contact is deposited over exposed top and side surfaces of the S/D region such that the S/D contact contacts the exposed second portion of the top surface of the bottom metal layer. The wrap-around contact formed in accordance with aspects of the invention includes the S/D contact and the bottom metal layer.

In embodiments of the invention where the transistor is a nanosheet FET, the bottom metal layer is non-uniform (or non-conformal) such that a height of the bottom metal layer tapers where the bottom metal layer is closer to the stacked nanosheets. In embodiments of the invention, the terms "non-conformal," "non-uniform," "non-planar," and equivalents thereof used to describe a layer means that the thickness of the layer is not substantially the same on all surfaces, or that the thickness variation is greater than about 15% of the nominal thickness of the layer. In accordance with aspects of the invention, forming the bottom metal layer as a non-uniform layer having a non-planer top surface that tapers downward as the top surface moves toward the stacked nanosheets ensures that ends of the channel nanosheets remain exposed (i.e., metal is not on the ends of the channel nanosheets) to allow the S/D regions to be epitaxially grown therefrom. In accordance with aspects of the invention, forming the bottom metal layer as a non-uniform layer that tapers toward the stacked nanosheets helps to reduce the capacitance between the gate and the S/D regions.

Turning now to a more detailed description of fabrication operations according to aspects of the invention, FIGS. 1-11B depict a nanosheet-based structure 100 after various fabrication operations for forming a nanosheet FET having a wrap-around S/D contact 1206 (shown in FIG. 11C) configured and arranged to reduce S/D contact resistance in accordance with aspects of the invention. More specifically, FIG. 1 depicts a cross-sectional view of the nanosheet-based structure 100 after initial fabrication operations in accordance with aspects of the present invention. As shown in FIG. 1, an alternating series of SiGe sacrificial nanosheet layers 122, 124, 126 and Si nanosheet layers 114, 116, 118 are formed in a stack 120 on a substrate 102. In some embodiments of the invention, the SiGe nanosheet layers 122, 124, 126 can be SiGe 25%. The notation "SiGe 25%" is used to indicate that 25% of the SiGe material is Ge and 75% of the SiGe material is Si.

In embodiments of the invention, the stack 120 can be formed by epitaxially growing one layer and then the next until the desired number and desired thicknesses of the nanosheet layers 122, 114, 124, 116, 126, 118 are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, a bottom isolation region (e.g., an oxide) (not shown) 104 is formed over the substrate 102 by depositing an initial SiGe layer on the substrate 102, and providing the initial SiGe layer with a higher Ge percentage to provide etch selectivity of the initial SiGe layer. After forming the remaining layers of the stack 120, the initial SiGe layer is removed and replaced with an oxide to provide a bottom isolation region.

FIG. 2A depicts a top-down view of the nanosheet-based structure 100 after additional fabrication operations in accordance with aspects of the present invention, and FIG. 2B depicts a cross-sectional view of the nanosheet-based structure 100 shown in FIG. 2A taken along line A-A'. As best shown in FIG. 2B, known fabrication operations have been used to form the nanosheet-based structure 100 having elongated fin-shaped stacks 120A, dummy gates 202, gate spacers 302, and hard masks (HM) 204, configured and arranged as shown. The known fabrication operations can include depositing a layer of amorphous silicon (a-Si) (not shown) over the stack 120 (shown in FIG. 1), and planarizing the a-Si to a desired level. A patterned hard mask (e.g., a nitride) (not shown) is deposited over the planarized a-Si. The pattern of the hard mask defines the footprints of the hard masks 204 and the dummy gates 202. An etch (e.g., an RIE) or a recess is applied to remove the portions of the a-Si layer that are not covered by the patterned hard mask to form the HMs 204 and the dummy gates 202 over and around the stack 120. Known semiconductor fabrication operations are used to form offset gate spacers 302 on sidewalls of the dummy gates 202. In embodiments of the invention, the offset gate spacers 302 can be formed using a spacer pull down formation process. The offset gate spacers 302 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE). The portions of the stack 120 that are not covered by the offset gate spacers 302 and the dummy gates 202 are etched, thereby forming the elongated fin-shaped stack 120A having the dummy gates 202 and gate spacers 302 formed over the top and sidewalls of each elongated fin-shaped stack 120A.

Figure 3:
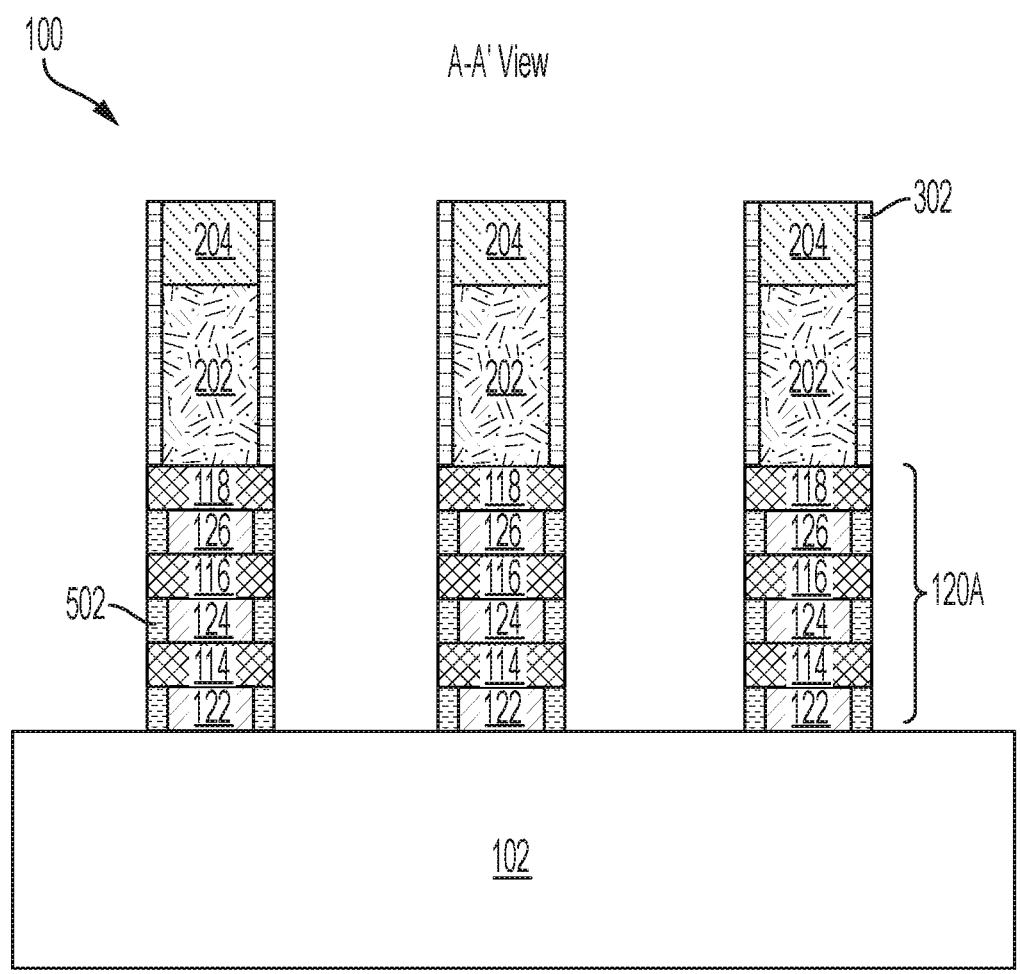

FIG. 3 depicts a cross-sectional view of the nanosheet-based structure 100 taken along line A-A' after fabrication operations in accordance with aspects of the invention. As shown in FIG. 3, known semiconductor fabrication operations have been used to partially remove end regions of the sacrificial nanosheets 122, 124, 126. For example, the end regions of the sacrificial nanosheets 122, 124, 126 can be removed using a so-called "pull-back" process to pull the sacrificial nanosheets 122, 124, 126 back an initial pull-back distance such that their end regions terminate underneath the offset gate spacers 302. In embodiments of the invention, the pull-back process includes a hydrogen chloride (HCL) gas isotropic etch process, which etches the sacrificial nanosheet material (e.g., SiGe) without attacking the channel nanosheet material (e.g., Si). Known semiconductor fabrication processes are then used to form inner spacers 502 in the space that was occupied by the removed end regions of the sacrificial nanosheets 122, 124, 126. In embodiments of the invention, the inner spacers 502 can be formed conformally by CVD, or by monolayer doping (MLD) of nitride followed by spacer RIE. The inner spacers 502 can be formed from a nitride containing material (e.g., silicon nitride (SiN)), which prevents excess gauging during subsequent RIE processes (e.g., sacrificial nanosheet removal) that are applied during the semiconductor device fabrication process.

Figure 4:
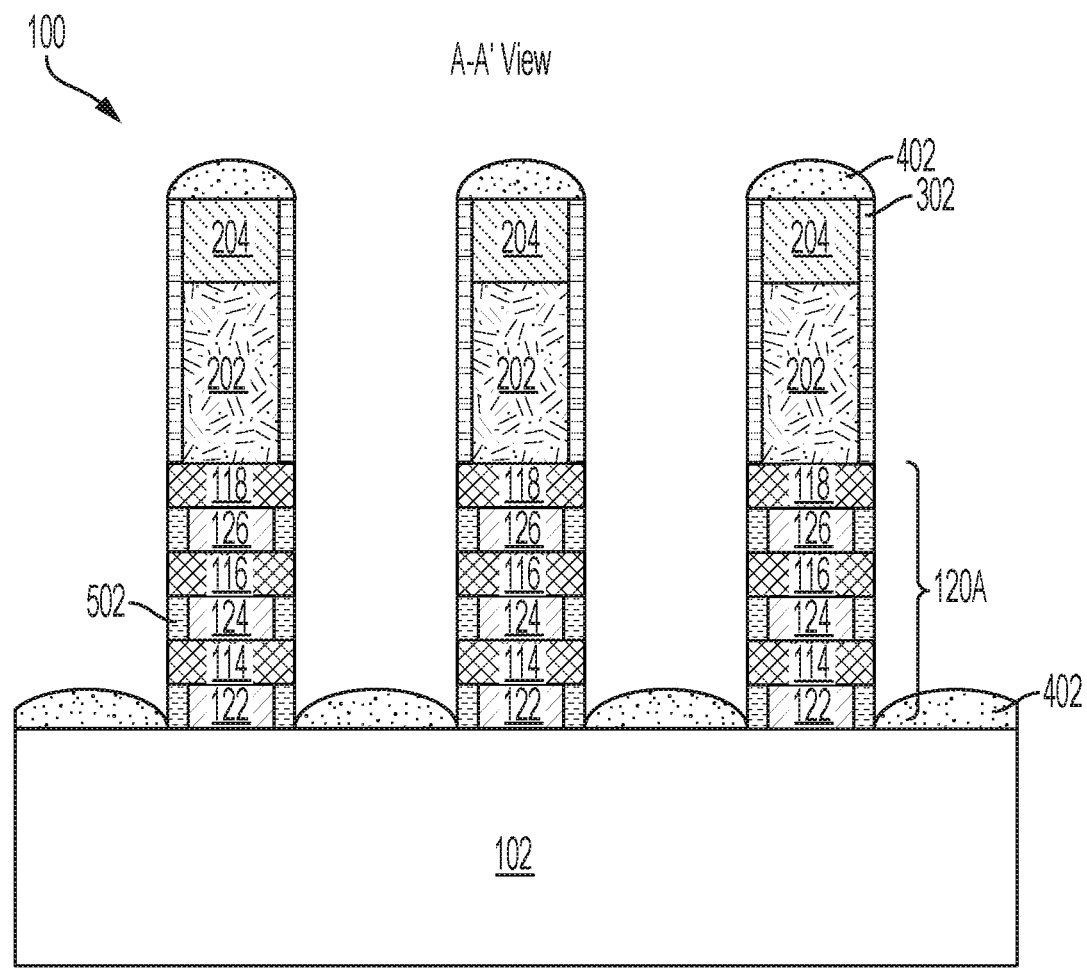

FIG. 4 depicts a cross-sectional view of the nanosheet-based structure 100 taken along line A-A' after fabrication operations in accordance with aspects of the invention. As shown in FIG. 4, known semiconductor fabrication operations have been used to deposit a non-conformal, non-uniform layer of metal over the structure 100 in order to form the non-conformal, non-uniform bottom metal layers 402, configured and arranged as shown. The non-uniform bottom layer 402 can include tungsten, ruthenium elemental metal (e.g., tungsten, ruthenium), an alloy of an elemental metal, a metal nitride, a metal silicide or combinations thereof. In embodiments of the invention, the layers 402 are deposited such that the layers 402 are only on the horizontal surfaces of the structure 100. In embodiments of the invention, the non-conformal, non-uniform bottom metal layer 402 can be deposited using, for example, a PVD metal deposition process. In embodiments of the invention, the non-conformal, non-uniform bottom metal layer 402 can be deposited using, for example, a conformal deposition followed by an etch back to remove metal from the vertical surfaces of the structure 100 and form the desired non-conformal, non-uniform profile of the bottom mental layers 402. In accordance with embodiments of the invention, the deposition of the bottom metal layer 402 is controlled such that the bottom metal layer 402 is taller (in the vertical direction) where the layer 402 is furthest away from the stack 120A, and such that the layer 120A tapers and is thinner where the layer 402 is closest to the stack 120A. Controlling the shape of the bottom metal layer 402 in this fashion minimizes the likelihood that the deposited metal will be on end regions of the Si nanosheets 114, 116, 118. Controlling the shape of the bottom metal layer 402 in this fashion (i.e., such that the layer 402 is non-uniform) also reduces unwanted capacitance between the metal gate stacks 802 (shown in FIG. 9) and the S/D regions 510, 520, 530, 540 (shown in FIG. 5) of the final nanosheet structure 100 (shown in FIGS. 12A and 12B).

Figure 5B:
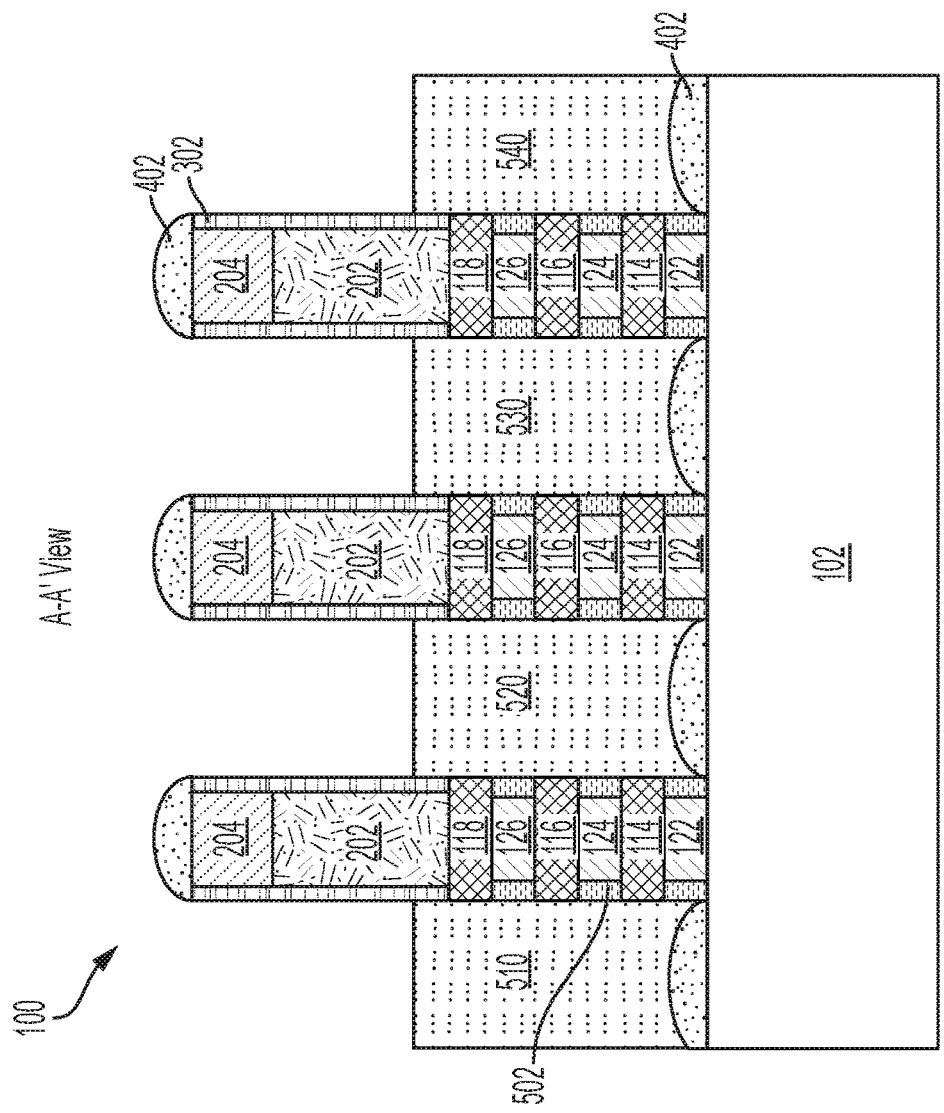
FIG. 5B depicts a cross-sectional view of the nanosheet-based structure shown in FIG. 5A taken along line A-A'.
Figure 5A:
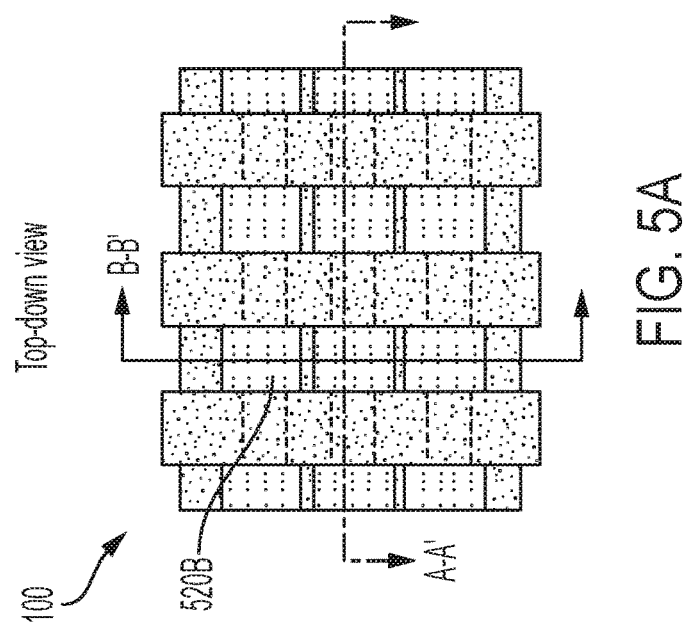
FIG. 5A depicts a top-down view of the nanosheet-based structure after additional fabrication operations in accordance with aspects of the present invention.

FIG. 5A depicts a top-down view of the nanosheet-based structure 100 after additional fabrication operations in accordance with aspects of the present invention, and FIG. 5B depicts a cross-sectional view of the nanosheet-based structure shown in FIG. 5A taken along line A-A'. As best shown in FIG. 5B, known semiconductor fabrication operations have been used to form raised S/D regions 510, 520, 530, 540 on and communicatively coupled to the bottom metal layers 402. In embodiments of the invention, the raised S/D regions 510, 520, 530, 540 are formed using an epitaxial layer growth process on the exposed ends of the channel nanosheets 114, 116, 118. In-situ doping (ISD) is applied to dope the S/D regions 510, 520, 530, 540, thereby creating the necessary junctions in the nanosheet-based structure 100. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

As shown in FIG. 5B, the nanosheet structure 100 will form three nanosheet FETs coupled in series. The leftmost nanosheet FET uses the leftmost dummy gate 802, the S/D region 510, and the S/D region 520. The center nanosheet FET uses the center dummy gate 802, the S/D region 520, and the S/D region 530. The rightmost nanosheet FET uses the rightmost dummy gate 802, the S/D region 530, and the S/D region 540. Thus, the S/D regions 520, 530 are shared.

Figure 5C:
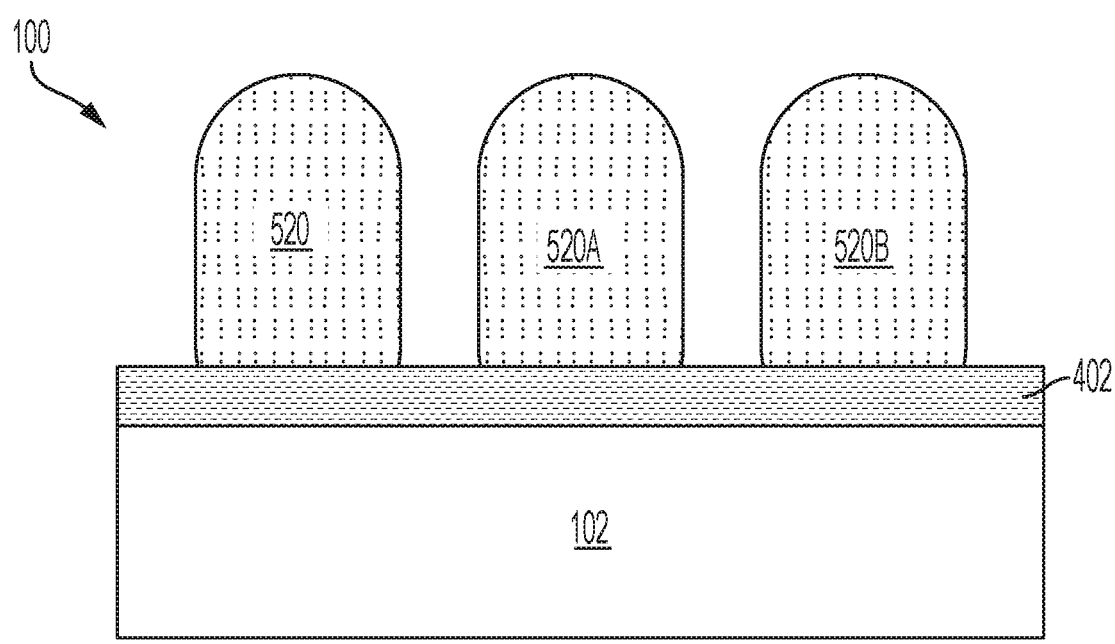
FIG. 5C depicts a cross-sectional view of the nanosheet-based structure shown in FIG. 5A taken along line B-B'.

FIG. 5C depicts a cross-sectional view of the nanosheet-based structure 100 shown in FIG. 5A taken along line B-B'. As shown in FIG. 5C, multiple rows of S/D regions are formed, which are shown in FIG. 5C as S/D regions 520, 520A, 520B. As best shown in FIGS. 5B and 5C, after forming the S/D regions 510, 520, 520A, 520B, 530, 540, in accordance with aspects of the invention, the surface area of the interface between the S/D contacts 1204 (and the liner 1202) (shown in FIGS. 11A and 11B) and the S/D regions 510, 520, 520A, 520B, 530, 540 is increased by, prior to forming the S/D regions 510, 520, 520A, 520B, 530, 540, depositing the bottom metal layer 402 and forming the S/D regions 510, 520, 520A, 520B, 530, 540 over the bottom metal layer 402 such that bottom surfaces of the S/D regions 510, 520, 520A, 520B, 530, 540 contact a first portion of a top surface of the bottom metal layer 602. As best shown in FIG. 11B, in aspects of the invention, the total top surface of the bottom metal layer 402 is larger than the bottom surface of the S/D regions 510, 520, 520A, 520B, 530, 540 such that the S/D region bottom surfaces contact first portions of the top surface of the bottom metal layer 402, thereby leaving second portions of the top surface of the bottom metal layer 402 exposed. As shown in FIG. 11C, and as described in greater detail subsequently herein, the S/D contacts 1204 will be deposited over exposed top and side surfaces of the S/D regions 510, 520, 520A, 520B, 530, 540 such that the S/D contacts 1204 contact the exposed second portions of the top surface of the bottom metal layer 402. The wrap-around contact 1206 (shown in FIG. 11C) formed in accordance with aspects of the invention includes the S/D contact 1204 communicatively coupled to the bottom metal layer 402.

Figure 6:
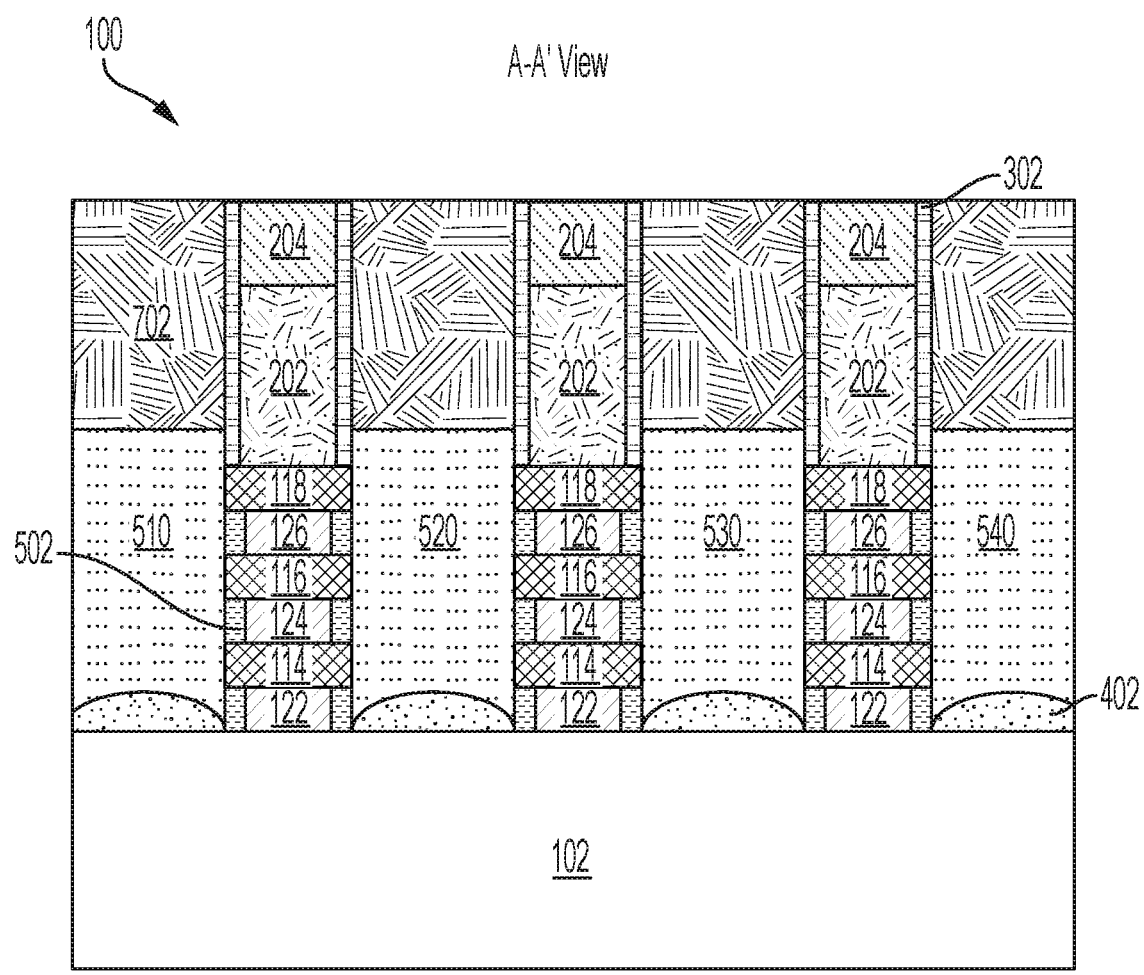

FIG. 6 depicts a cross-sectional view, taken along line A-A', of the nanosheet-based structure 100 after additional fabrication operations in accordance with aspects of the invention. As shown in FIG. 6, known semiconductor fabrication operations have been used to form an interlayer dielectric (ILD) region 702. The ILD region 702 can be formed by depositing an oxide material in bulk (e.g., silicon dioxide) and polishing the bulk oxide (including the non-conformal metal 402 on the HM 204) back (e.g., using CMP) to the level of the hard mask 204.

Figure 7:
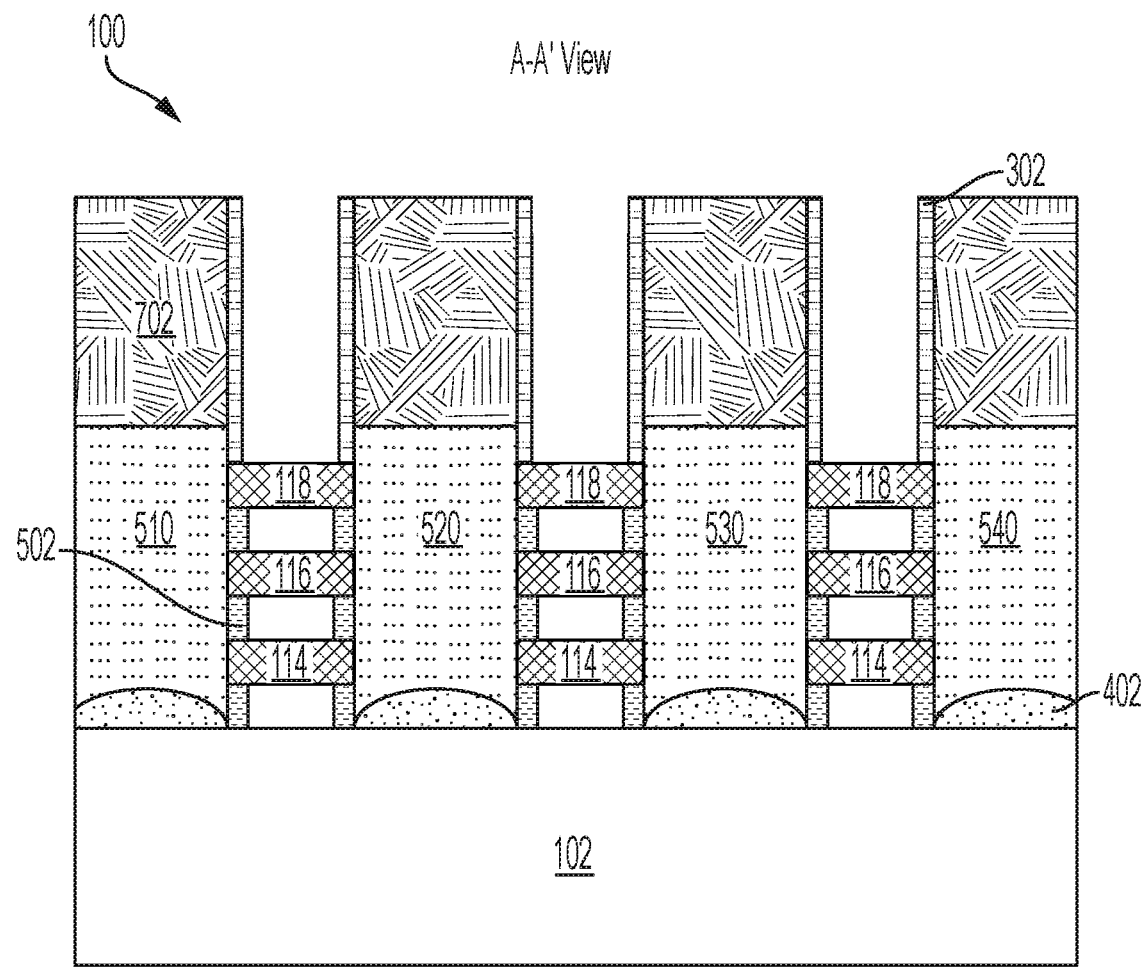

FIG. 7 depicts a cross-sectional view, taken along line A-A', of the nanosheet-based structure 100 after additional fabrication operations in accordance with aspects of the invention. As shown in FIG. 7, known semiconductor fabrication operations (e.g., a replacement metal gate (RMG)

process) have been used remove the HMs 204 (shown FIG. 6) and the dummy gates 202 (shown in FIG. 6) using, for example, a known etching process, e.g., RIE or chemical oxide removal (COR). Additionally, known semiconductor fabrication operations have been used to remove the sacrificial nanosheet regions 122, 124, 126 (shown in FIG. 6). In embodiments of the invention, the sacrificial nanosheet regions 122, 124, 126 can be removed by applying a selective etch (e.g., a hydrochloric acid (HCl)).

Figure 8:
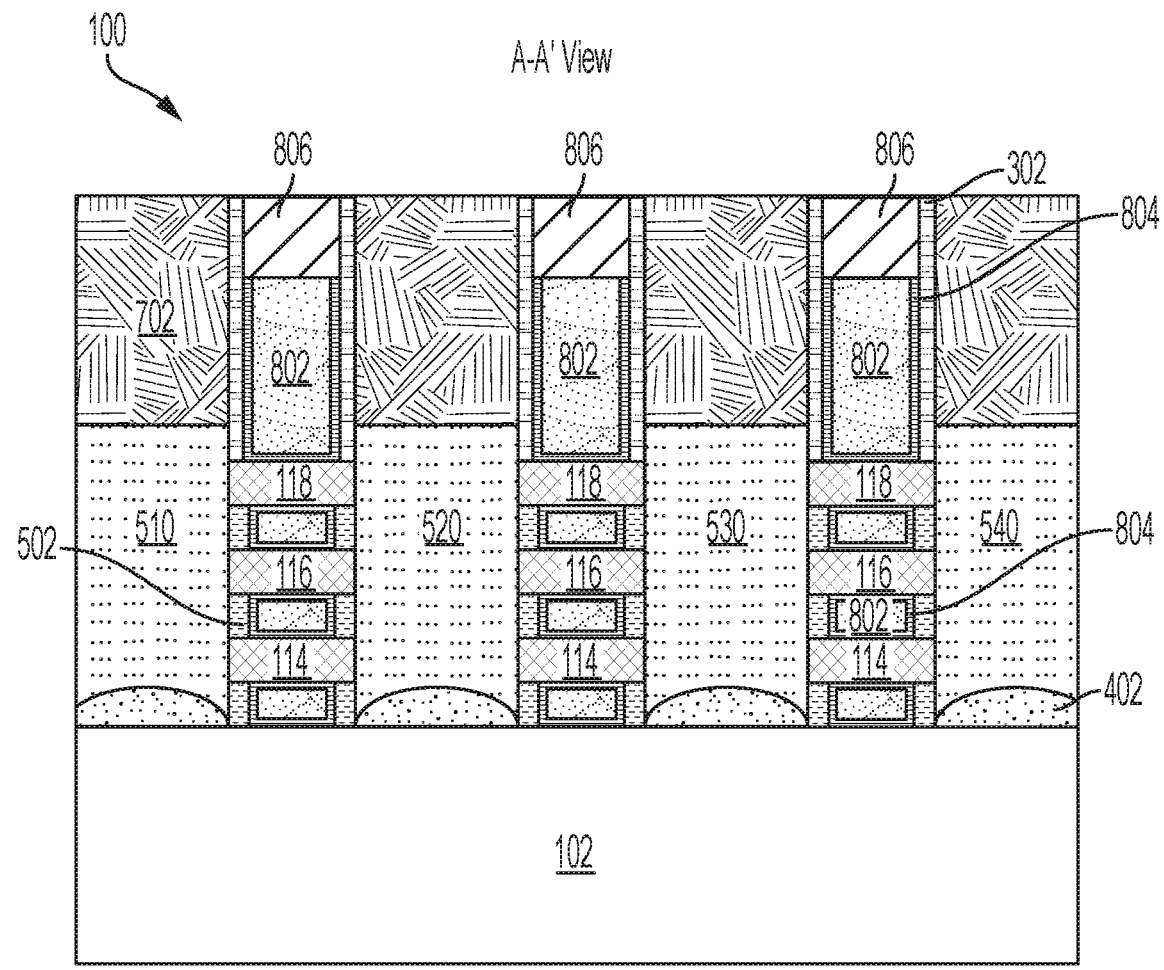

FIG. 8 depicts a cross-sectional view, taken along line A-A', of the nanosheet-based structure 100 after additional fabrication operations in accordance with aspects of the invention. As shown in FIG. 8, known semiconductor fabrication processes have been used to replace the removed dummy gate 202 (shown in FIG. 6) with a multi-segmented gate stack structure 802, which can include a primary metal region, a work function metal (not shown separately), and a relatively thin (e.g., from about 0.7 nm to about 3 nm) high-k gate dielectric (e.g., hafnium oxide) 804. The primary metal region can be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The primary metal region can further include dopants that are incorporated during or after deposition. Examples of suitable materials for the gate dielectric 804 include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric 804 can further include dopants such as lanthanum, aluminum, magnesium. In some embodiments of the invention, the gate dielectric can further include silicon oxide, silicon nitride, silicon oxynitride, or any suitable combination of those materials with high-k dielectric material. In embodiments of the invention, the relatively thin gate dielectric 804 is between the channel nanosheets 114, 116, 118 and the gate stack structure 802 to prevent shorting. In embodiments of the invention, the replacement metal gate can include work-function metal (WFM) layers. The WFM layer(s) can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

The gate stack structure 802 surrounds the stacked channel nanosheet channels 114, 116, 118 and regulates electron flow through the channel nanosheet channels 114, 116, 118 between the S/D regions 510, 520, 530, 540.

Referring still to FIG. 8, known semiconductor fabrication operations have been used to recess the gate stack 802 to the level shown, and form a cap layer 806 over the recessed gate stack 802. In embodiments of the invention, the cap layer 806 can be formed from a nitride or an oxide layer and combinations thereof.

Figure 9:
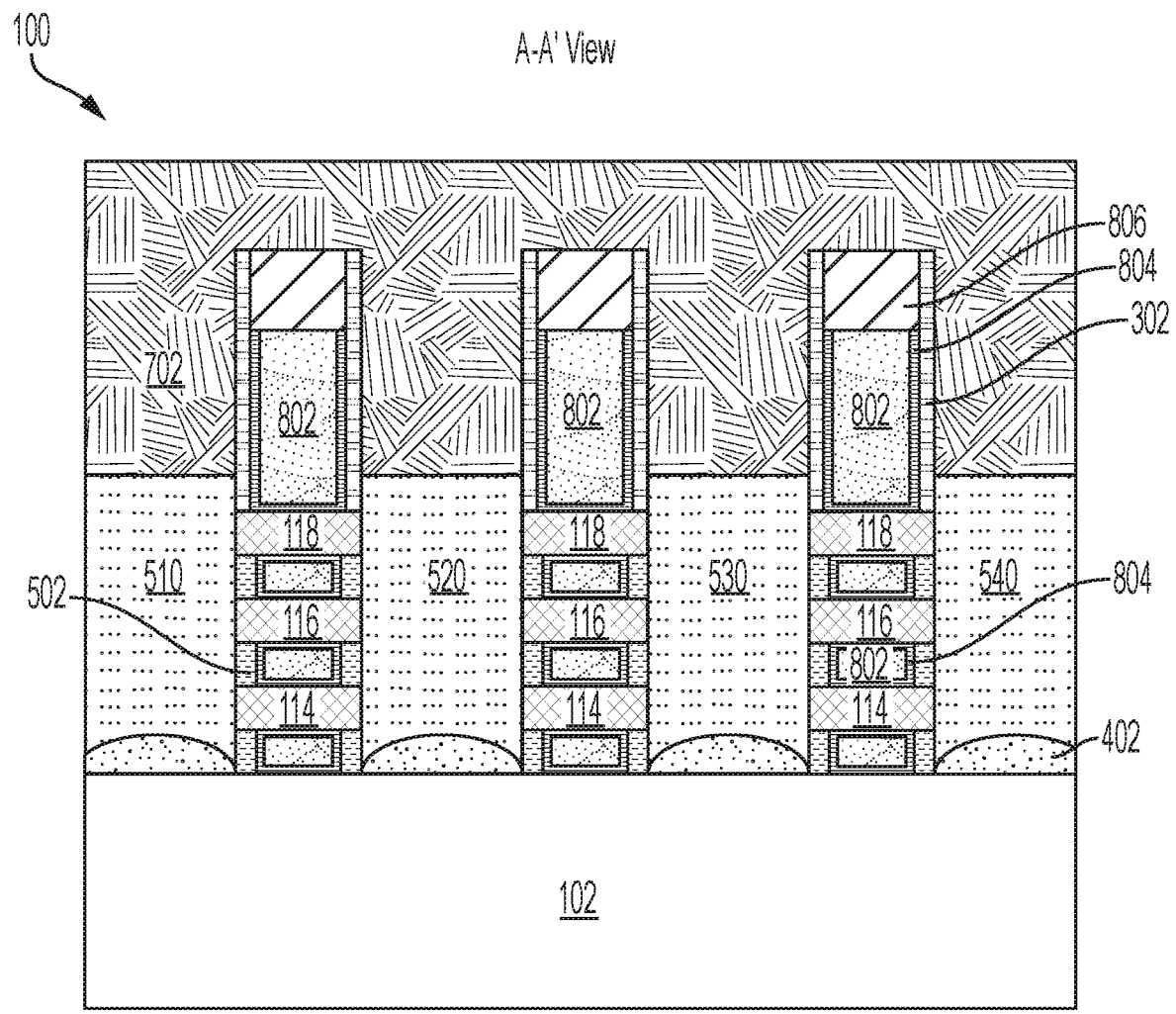

FIG. 9 depicts a cross-sectional view, taken along line A-A', of the nanosheet-based structure 100 after additional fabrication operations in accordance with aspects of the invention. As shown in FIG. 9, known semiconductor fabrication processes have been used to deposit then planarize an additional region of the ILD 702.

Figure 10A:
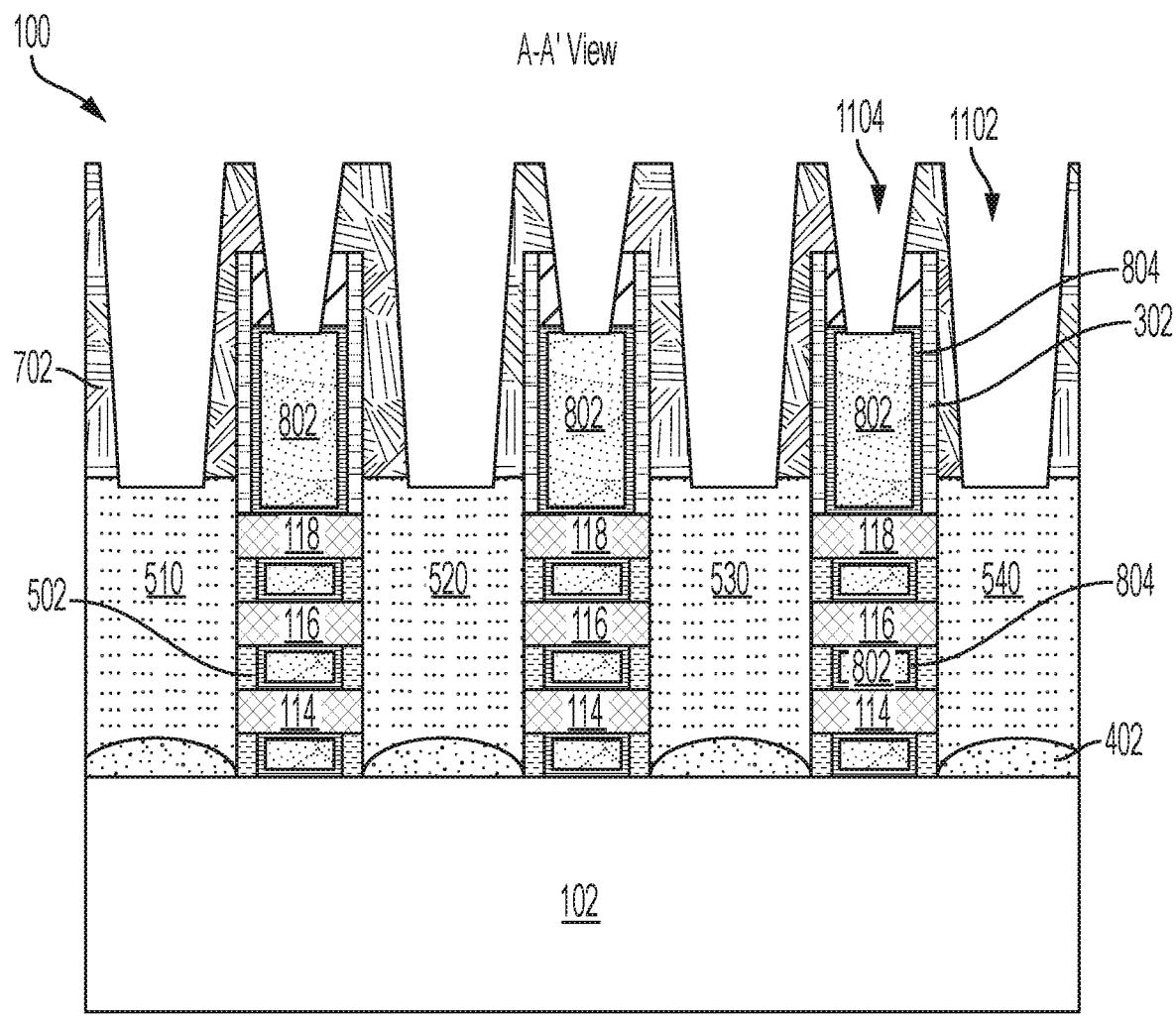
FIG. 10A depicts a cross-sectional view, taken along line A-A', of the nanosheet-based structure after additional fabrication operations in accordance with aspects of the invention.
Figure 10B:
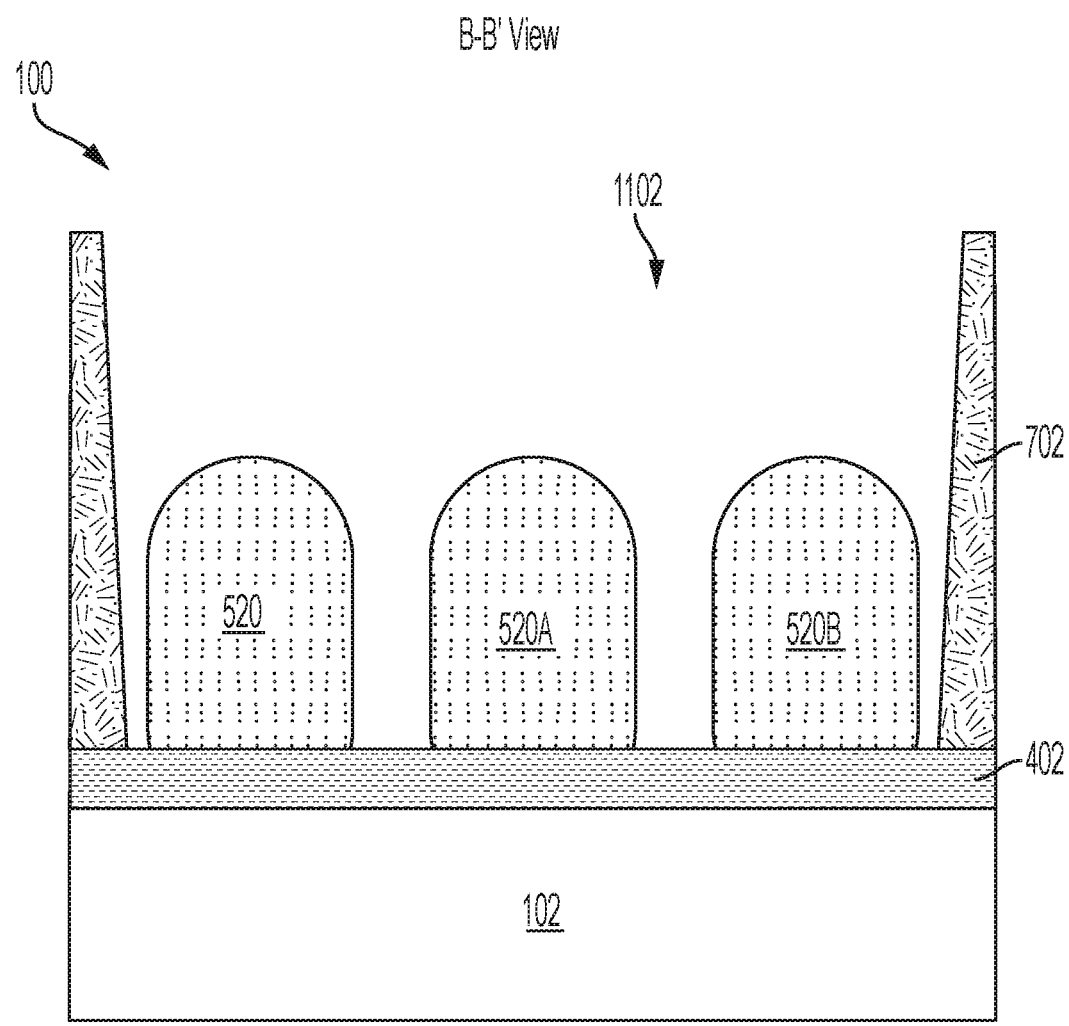
FIG. 10B depicts a cross-sectional view, taken along line B-B', of the nanosheet-based structure after additional fabrication operations in accordance with aspects of the invention.

FIG. 10A depicts a cross-sectional view, taken along line A-A', of the nanosheet-based structure 100 after additional fabrication operations in accordance with aspects of the invention, and FIG. 10B depicts a cross-sectional view, taken along line B-B', of the nanosheet-based structure 100 after additional fabrication operations in accordance with aspects of the invention. As best shown in FIG. 10A, known semiconductor fabrication processes have been used to form S/D contact trenches 1102 and gate contact trenches 1104 have been formed through the ILD 702 and the caps 806 (shown in FIG. 9).

Figure 11A:
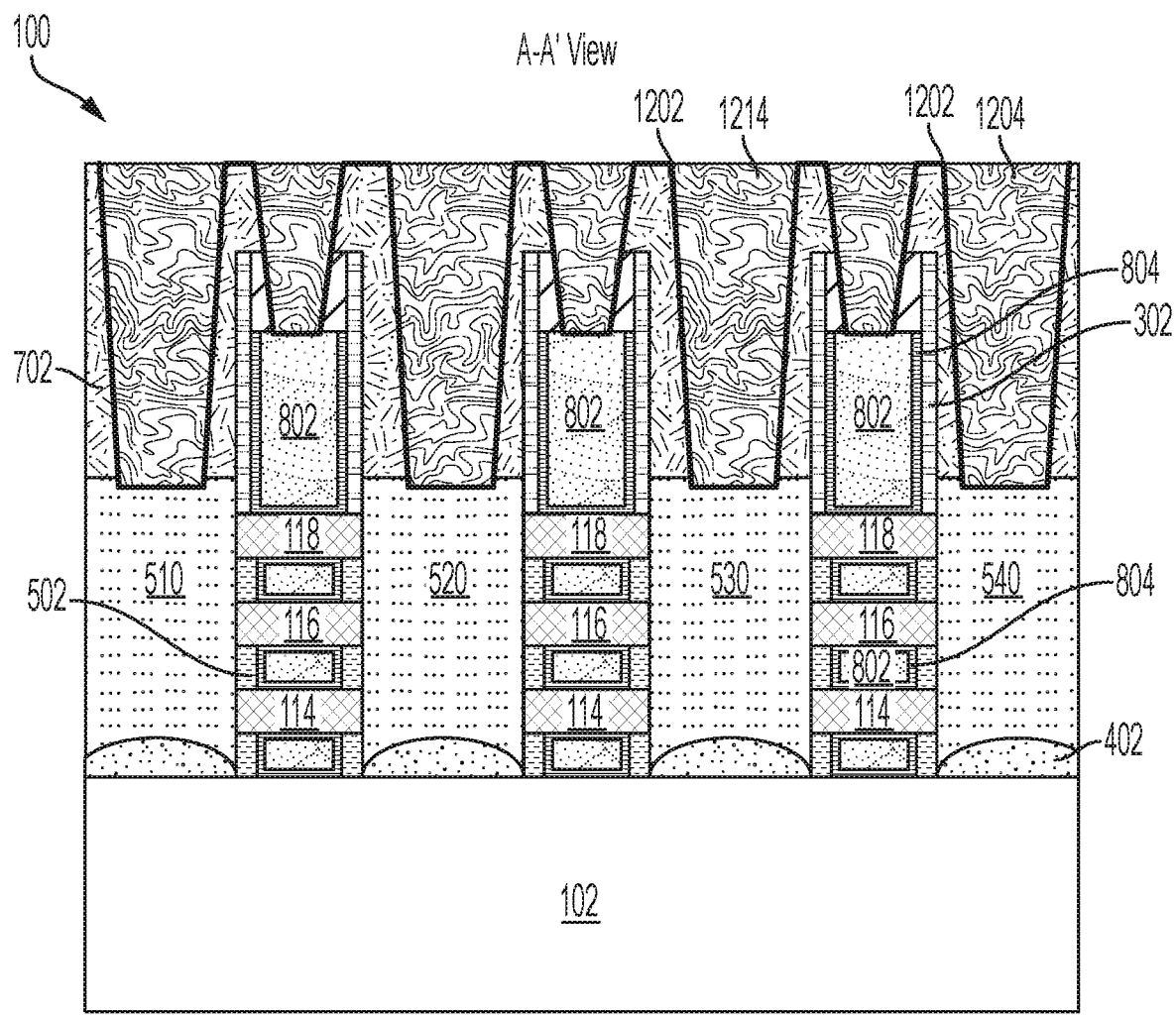
FIG. 11A depicts a cross-sectional view, taken along line A-A', of the nanosheet-based structure after fabrication operations to form a wrap-around S/D contact in accordance with aspects of the invention.
Figure 11B:
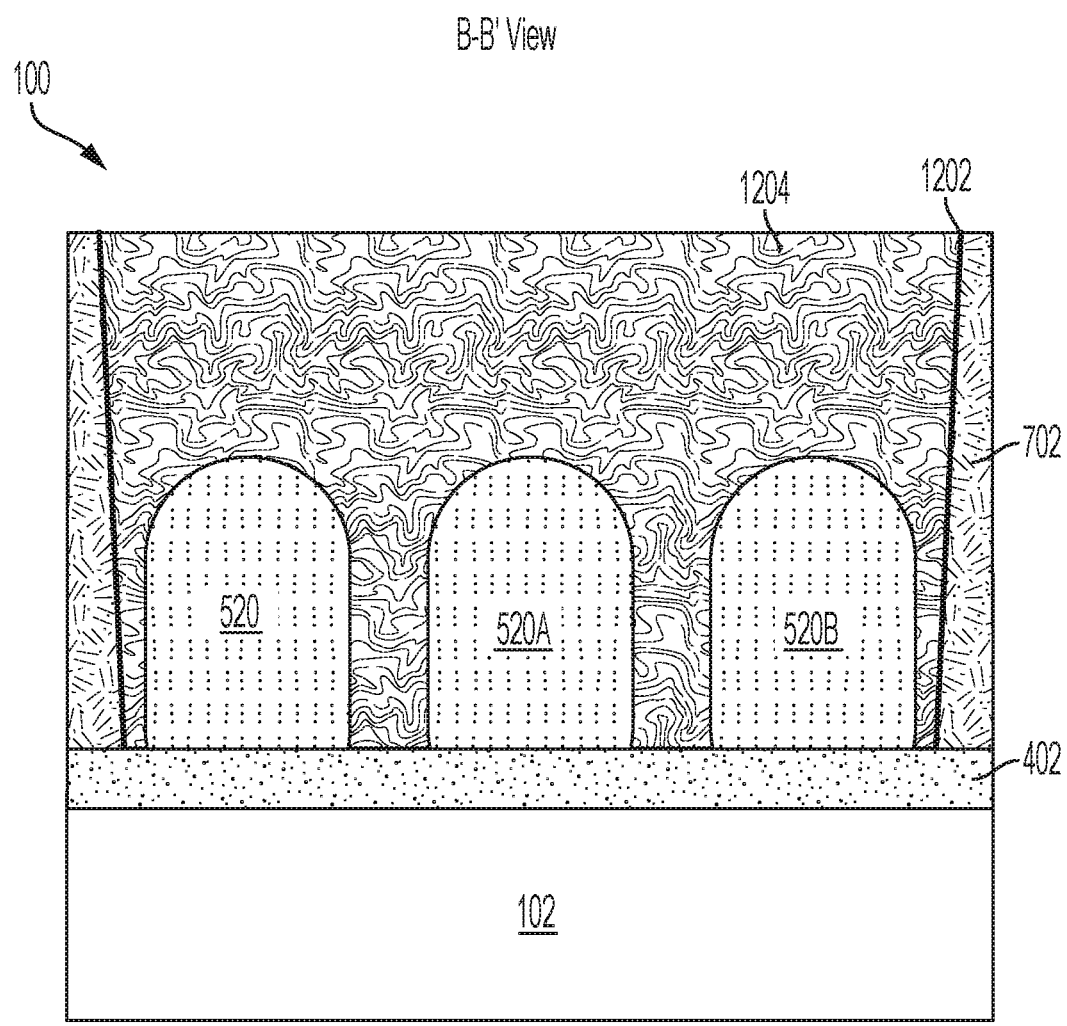
FIG. 11B depicts a cross-sectional view, taken along line B-B', of the nanosheet-based structure after fabrication operations to form the wrap-around S/D contact in accordance with aspects of the invention.
Figure 11C:
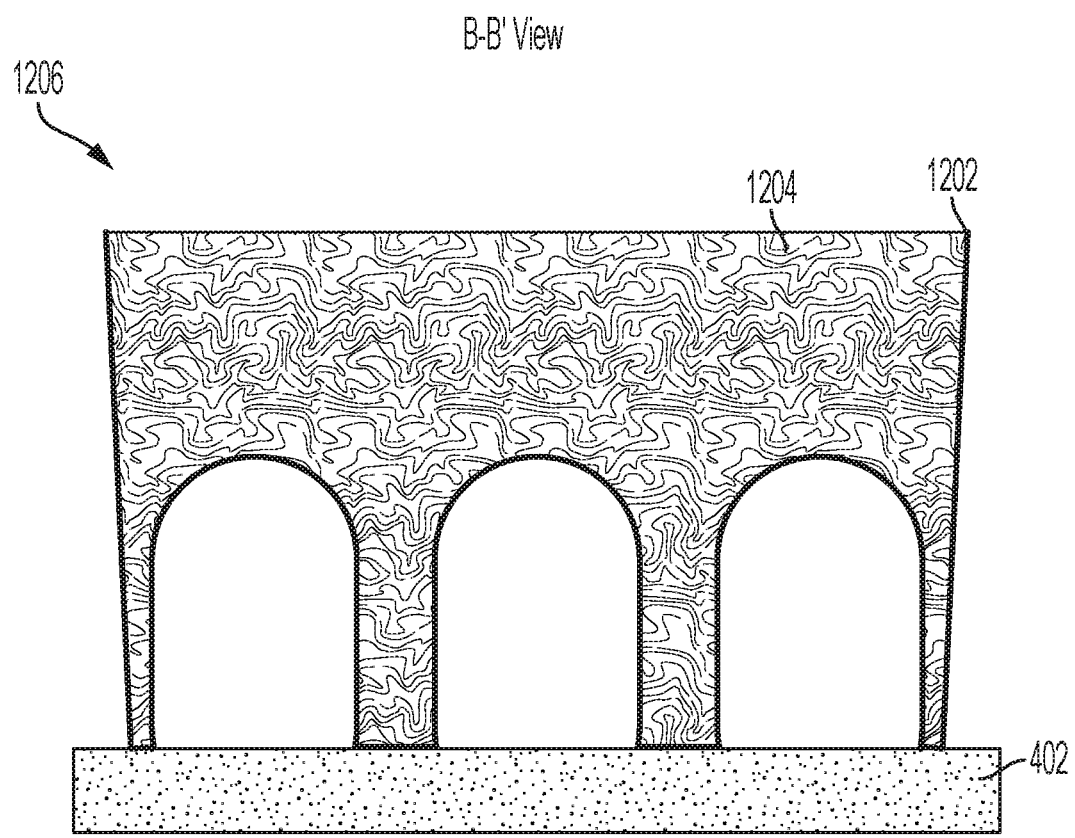

FIG. 11A depicts a cross-sectional view, taken along line A-A', of the nanosheet-based structure 100 after additional fabrication operations in accordance with aspects of the invention, and FIG. 11B depicts a cross-sectional view, taken along line B-B', of the nanosheet-based structure 100 after additional fabrication operations in accordance with aspects of the invention. As best shown in FIG. 11A, known semiconductor fabrication processes have been used to deposit liners 1202 and gate contacts 1214 in the gate contact trenches 1104 (shown in FIG. 10A). As best shown in FIGS. 11A and 11B, known semiconductor fabrication processes have been used to deposit the liners 1202 and S/D contacts 1204 in the S/D contact trenches 1102 (shown in FIG. 10A). The process used to deposit the S/D contacts 1204 and the gate contact 1214 can be considered self-aligned in that only exiting structures in the nanosheet structure 100 are used to define the footprints of the gate contacts 1214 and the S/D contacts 1204.

In embodiments of the invention, the liners 1202 are configured as contact liners that help minimize contact resistance. Example materials for forming the contact liners 1202 include tantalum nitride and tantalum (TaN/Ta), titanium, titanium nitride, cobalt, ruthenium, and manganese. The gate contacts 1214 and the S/D contacts 1204 can be tungsten (W), aluminum (Al), copper (Cu), cobalt (Co), which can further include a barrier layer (not shown). The gate contacts 1214 and the S/D contacts 1204 can also be formed from any of the conductive materials previously described herein as suitable conductive materials for the gate 802 and/or the non-uniform bottom metal layers 402. In some embodiments of the invention, the gate contacts 1214 and/or the S/D contacts 1204 can be formed from conductive material that is different from the bottom non-conformal metal 402. In accordance with aspects of the invention, the S/D contact 1204 and the non-uniform bottom metal layers 402 form the wrap-around contact 1206 (shown in FIG. 11C). In accordance with aspects of the invention, because the non-uniform bottom metal layer 402 of the wrap-around contact 1206 is formed at a different fabrication stage than the S/D contact 1204 of the wrap-around contact 1206, and because the bottom metal layer 402 is deposited in a manner that results in a non-uniform profile that is different than the profile of the S/D contacts 1204, the non-uniform bottom metal layers 402 can be formed using a fabrication process that is suitable for the fabrication stage and non-uniform profile of the bottom metal layers 402, and the S/D contacts 1204 can be formed using a fabrication process that is suitable for the fabrication stage and the profile of the S/D contacts 1204. Accordingly, the conductive material used to form the non-uniform bottom layer 402 can be first conductive material(s) that are compatible with the fabrication process that has been selected to form the non-uniform bottom metal layers 402, and the conductive material used to form the S/D contacts 1206 can be second conductive material(s) that are compatible with the fabrication process that has been selected to form the S/D contacts 1206.

The barrier layer can be titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top S/D regions 510, 520, 530, 540 and/or the material that forms the metal gates 802. In various embodiments, the barrier layer and/or the liners 1202 can be conformally deposited in the trenches 1104, 1102 (shown in FIG. 10A) by ALD, CVD, MOCVD, PECVD, or combinations thereof. In embodiments of the invention, the metal fill of the gate contacts 1214 and the S/D contacts 1202 can be formed by ALD, CVD, and/or PVD.

FIG. 11B depicts a cross-sectional view, taken along line B-B', of the nanosheet-based structure 100 after fabrication operations described above in connection with FIG. 11A to form the wrap-around S/D contact 1206, which is shown in isolation in FIG. 11C. As shown in FIG. 11C, the S/D contacts 1204 have been deposited over exposed top and side surfaces of the S/D regions 510, 520, 520A, 520B, 530, 540 such that the S/D contacts 1204 contact the exposed second portions of the top surface of the bottom metal layer 402. The wrap-around contact 1206 formed in accordance with aspects of the invention includes the S/D contact 1204 communicatively coupled to the bottom metal layer 402.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a set of semiconductor devices, the method comprising:
    performing fabrication operations to form a set of field effect transistor (FET) devices on a substrate, wherein the fabrication operations include:
        forming a first channel region over a first region of the substrate;
        forming a second channel region over a second region of the substrate and adjacent to the first channel region; and
        forming over a third region of the substrate a bottom conductive layer operable to form a bottommost component of a multi-component wrap-around source or drain (S/D) contact;
    wherein the first region of the substrate, the second region of the substrate, and the third region of the substrate do not overlap;

wherein the bottom conductive layer includes a non-uniform height having a first section and a second section; and
wherein the first section tapers downward toward the first channel region and the second section tapers downward toward the second channel region.

2. The method of claim 1 further comprising:
using the first channel region and the second channel region to form a shared S/D region over the bottom conductive layer and between the first channel region and the second channel region;
wherein the shared S/D region is not a component of the multi-component S/D contact;
wherein the shared S/D region is communicatively coupled to the first channel region, the second channel region, and the bottom conductive layer;
wherein the shared S/D region is formed subsequently to forming the bottom conductive layer; and
wherein the first section tapers downward toward the first channel region and the second section tapers downward toward the second channel region such that:
portions of the bottom conductive layer that are closest to the first channel region do not contact a first sidewall of the first channel region; and
portions of the bottom conductive layer that are closest to the second channel region do not contact a first sidewall of the second channel region.

3. The method of claim 2 further comprising:
forming over the shared S/D region a top S/D contact region operable to form an upper component of the multi-component wrap-around S/D contact; and
communicatively coupling the top S/D contact region to the bottom conductive layer such that the top S/D contact region coupled to the bottom conductive layer defines a central opening;
wherein the central opening is occupied by the shared S/D region.

4. The method of claim 3 further comprising:
forming the bottom conductive layer from a first conductive material using a first set of fabrication operations; and
forming the top S/D contact region from a second conductive material using a second set of fabrication operations;
wherein the first conductive material is different than the second conductive material; and
wherein the first set of fabrication operations is different than the second set of fabrication operations.

5. The method of claim 3, wherein a surface area of an interface between the wrap-around S/D contact and the shared S/D region comprises:
a first surface area of an interface between the shared S/D region and a first portion of a top surface of the bottom conductive layer; and
a second surface area of an interface between the top S/D contact region and the shared S/D region.

6. The method of claim 3, wherein the shared S/D region is communicatively coupled to the bottom conductive layer through a first region of the top surface of the bottom conductive layer.

7. The method of claim 6, wherein the top S/D contact region is communicatively coupled to the bottom conductive layer through a second region of the top surface of the bottom conductive layer.

8. The method of claim 3, wherein:
the top S/D contact region comprises:
a contact liner;
a barrier liner; and
a conductive metal.

9. The method of claim 1, wherein:
the first section that tapers downward toward the first channel region reduces a first capacitance between a first gate of the first channel and a shared S/D region over the bottom conductance layer; and
the second section that tapers downward toward the second channel region reduces a second capacitance between a second gate of the second channel and the shared S/D region over the bottom conductance layer.

10. A method of forming a set of semiconductor devices, the method comprising:
forming a channel region over a first region and a second region of a substrate;
forming over a third region of the substrate a bottom conductive layer operable to form a bottommost component of a multi-component wrap-around source or drain (S/D) contact;
wherein the first region of the substrate, the second region of the substrate, and the third region of the substrate do not overlap; and
forming a shared S/D region over the bottom conductive layer and adjacent to the channel region;
wherein the channel region comprises a first channel stack over the first region of the substrate and a second channel stack over the second region of the substrate;
wherein the first channel stack comprises a first set of stacked and spaced-apart channel nanosheets;
wherein the second channel stack comprises a second set of stacked and spaced-apart channel nanosheets;
wherein the shared S/D region is shared by the first channel stack and the second channel stack;
wherein a non-uniform height of the bottom conductive layer tapers downward for portions of the bottom conductive layer that are closest to the first channel stack;
wherein the non-uniform height of the bottom conductive layer tapers downward for portions of the bottom conductive layer that are closest to the second channel stack; and
wherein the shared S/D region is not a component of the multi-component S/D contact.

11. The method of claim 10 further comprising:
forming over the shared S/D region a top S/D contact region operable to form an upper component of the multi-component wrap-around S/D contact; and
communicatively coupling the top S/D contact region to the bottom conductive layer such that the top S/D contact region coupled to the bottom conductive layer defines a central opening;
wherein the central opening is occupied by the shared S/D region.

12. The method of claim 11, wherein forming the shared S/D region comprises:
epitaxially growing the shared S/D region from the first set of stacked and spaced-apart channel nanosheets; and
epitaxially growing the shared S/D region from the second set of stacked and spaced-apart channel nanosheets such that the shared S/D region extends over and is communicatively coupled to the bottom conductive layer of the wrap-around S/D contact.

* * * * *